United States Patent
Lai

(10) Patent No.: US 7,737,760 B2
(45) Date of Patent: Jun. 15, 2010

(54) MIXER HAVING CONTROLLABLE LOAD WITH REDUCED EQUIVALENT LOAD VALUE DURING SWITCHING TRANSIENTS OF LOCAL OSCILLATING SIGNAL

(75) Inventor: Jie-Wei Lai, Taipei (TW)

(73) Assignee: Mediatek Inc., Science Based Industrial Park, Hsin-Chu (TW)

( * ) Notice: Subject to any disclaimer, the term of this patent is extended or adjusted under 35 U.S.C. 154(b) by 4 days.

(21) Appl. No.: 12/123,483

(22) Filed: May 20, 2008

(65) Prior Publication Data
US 2009/0289687 A1 Nov. 26, 2009

(51) Int. Cl.
*G06G 7/12* (2006.01)
(52) U.S. Cl. .................. 327/355; 327/361; 455/326; 455/333
(58) Field of Classification Search ......... 327/355–361; 455/326, 333
See application file for complete search history.

(56) References Cited

U.S. PATENT DOCUMENTS

| | | | |
|---|---|---|---|
| 7,356,317 B2 * | 4/2008 | Xu et al. | 455/130 |
| 2005/0164671 A1 | 7/2005 | Darabi | |
| 2007/0066269 A1 * | 3/2007 | Kivekas et al. | 455/326 |
| 2009/0239495 A1 * | 9/2009 | Sellars et al. | 455/333 |

OTHER PUBLICATIONS

"Direct-Conversion WCDMA Transmitter with -163dBc/Hz Noise at 190MHz Offset",Jones, ISSCC 2007/Session 19/Cellular and Multi-mode Transceivers/19.1, pp. 336-337 and 607, Feb. 13, 2007.*
"A Linear Uplink WCDMA Modulator with -156dBc/Hz Downlink SNR", Papadopoulos, ISSCC 2007/Session 19/Cellular and Multi-mode Transceivers/19.2, pp. 338-339 and 607, Feb. 13, 2007.*

* cited by examiner

Primary Examiner—Lincoln Donovan
Assistant Examiner—Shikha Goyal
(74) Attorney, Agent, or Firm—Winston Hsu

(57) ABSTRACT

A mixer has a controllable load, a signal mixing module, and a controller. The controllable load is controlled by a control signal to change an equivalent load value thereof. The signal mixing module has an output port coupled to the controllable load and an input port coupled to an input signal, and is used for mixing the input signal with a local oscillation signal. The controller is coupled to the controllable load, and is used for generating the control signal to reduce the equivalent load value of the controllable load during switching transients of the local oscillation signal.

19 Claims, 7 Drawing Sheets

MIXER HAVING CONTROLLABLE LOAD WITH REDUCED EQUIVALENT LOAD VALUE DURING SWITCHING TRANSIENTS OF LOCAL OSCILLATING SIGNAL

BACKGROUND

The present invention relates to mixing an input signal with a local oscillating signal, and more particularly, to a mixer having a controllable load with reduced equivalent load value during switching transients of a local oscillating signal.

Wireless communication devices are widely used in a variety of fields. In general, each wireless communication has a transmitter for converting user data into RF signals for data transmission and a receiver for converting received RF signals into user data for data reception. In either of the transmitter and the receiver, a mixer plays an important role in transmitting/receiving the RF signal. Regarding the transmitter, the mixer mixes the input signal, either a baseband signal or an intermediate frequency signal, with a local oscillating (LO) signal to produce the RF signal to be transmitted. Regarding the receiver, the mixer mixes the RF signal received by an antenna with the local oscillating signal to produce either a baseband signal or an intermediate frequency signal.

More specifically, a CMOS-based mixer design is often employed to implement mixers inside the transmitter and the receiver of a wireless communication device. One problem known for CMOS-based mixers is the undesired low-frequency flicker noise originated from the noisy transistors and presented at the mixer output as interference, which degrades the mixer performance greatly. Some conventional solutions have been developed and applied to CMOS-based mixers, especially active mixers, to alleviate or eliminate the interference caused by flicker noise mixed with the local oscillating signal during switching transients of the local oscillating signal, i.e., at or around the zero-crossing of the local oscillating signal. For example, dynamic current injecting, dynamic current quenching, or dynamic current switching is applied to typical active mixers to block DC current from passing through transistors switched by local oscillating signal during the switching transients. However, additional circuit components added to the typical active mixer will induce static or dynamic DC offset current flowing to the transistors switched by local oscillating signal, resulting in LO leakage at the transmitter and second-order intercept point (IP2) at the receiver. Removing these unpredictable DC offsets is difficult, even though a predetermined calibration mechanism is employed. Furthermore, aforementioned dynamic current injecting/quenching/switching technique is applicable to active mixers only. In other words, regarding the passive mixers having no DC current, the conventional dynamic current injecting/quenching/switching technique fails.

SUMMARY

It is therefore one of the objectives of the present invention to provide a mixer having a controllable load with reduced equivalent load value during switching transients of a local oscillating signal.

According to one exemplary embodiment of the present invention, the mixer has a controllable load, a signal mixing module, and a controller. The controllable load is controlled by a control signal to change an equivalent load value thereof. The signal mixing module includes an output port coupled to the controllable load and an input port coupled to an input signal, and is used for mixing the input signal with a local oscillation signal. The controller is coupled to the controllable load, and is used for generating the control signal to reduce the equivalent load value of the controllable load during switching transients of the local oscillation signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
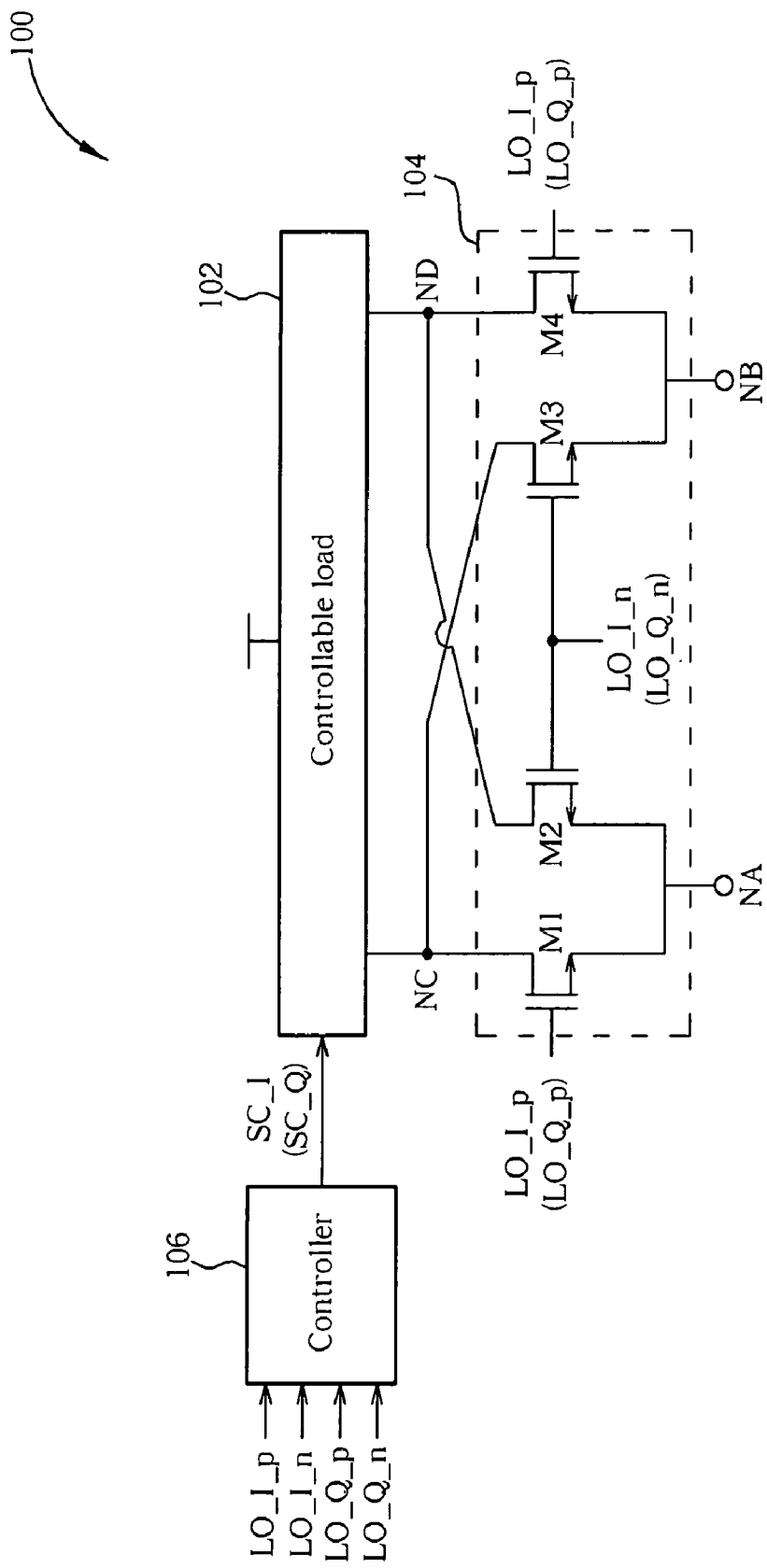
FIG. 1 is a diagram illustrating a mixer according to an exemplary embodiment of the present invention.

FIG. 1 is a diagram illustrating a mixer 100 according to an exemplary embodiment of the present invention. As shown in FIG. 1, the mixer 100 includes, but is not limited to, a controllable load 102, a signal mixing module 104, and a controller 106. Please note that only the circuit components pertinent to the present invention are shown in FIG. 1 for simplicity. In this embodiment, the controllable load 102 is controlled by a control signal SC_I/SC_Q to change an equivalent load value thereof. Certain exemplary implementations of the controllable load 102 will be illustrated later to more clearly detail features of the present invention. The signal mixing module 104 includes a plurality of transistors M1, M2, M3, and M4 for mixing an input signal received at an input port including nodes NA and NB with an local oscillating signal (LO_I_p, LO_I_n) if the mixer 100 is for in-phase signal processing or (LO_Q_p, LO_Q_n) if the mixer 100 is for quadrature-phase signal processing. A resultant signal generated from the signal mixing module 104 is outputted at an output port including nodes NC and ND coupled to the controllable load 102 respectively. It should be noted that the input signal can be fed into the input port of the signal mixing module 104 through active mixer configuration or passive mixer configuration. In other words, the mixer architecture shown in FIG. 1 can be employed in an active mixer or a passive mixer, depending upon actual design requirements. The controller 106 is coupled to the controllable load 106 for generating the control signal SC_I/SC_Q according to the local oscillating signal (i.e., LO_I_p, LO_I_n, LO_Q_p, LO_Q_n) to thereby reduce the equivalent load value of the controllable load 102 during switching transients of the local oscillation signal.

Figure 2:
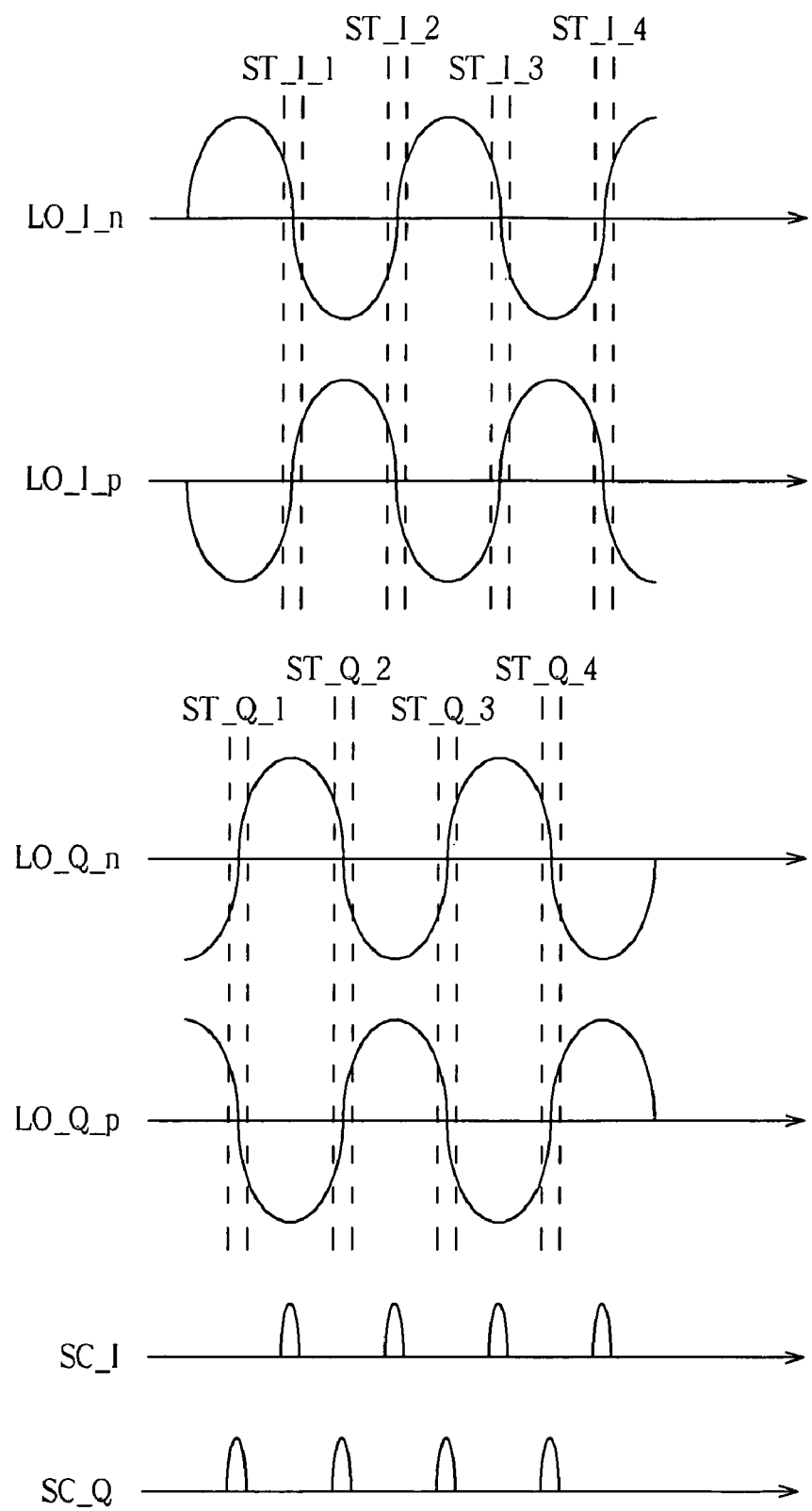
FIG. 2 is a waveform diagram of a local oscillation signal and a control signal according to an exemplary embodiment of the present invention.

Please refer to FIG. 2. FIG. 2 is a waveform diagram of the local oscillation signal and the control signal according to an exemplary embodiment of the present invention. Provided that the mixer 100 is applied to in-phase signal processing, the transistors M1-M4 shown in FIG. 1 are selectively turned on or off according to the local oscillating signal including LO_I_p and LO_I_n, and the switching transients ST_I_1-ST_I_4 occur around the zero-crossing points of LO_I_p and LO_I_n. The controller 106 is configured to generate the control signal SC_I, including a plurality pulses corresponding to the switching transients. After receiving the control signal SC_I, the controllable load 102 is controlled by these pulses to reduce its equivalent load value. As the load of the signal mixing module 104 is reduced or removed during the switching transient, the current passing through conductive transistors in the signal mixing module 104 is accordingly reduced or eliminated during the switching transient. In this way, noise at the mixer output is suppressed or blocked during the switching transients. Similarly, provided that the mixer 100 is applied to quadrature-phase signal processing, the transistors M1-M4 shown in FIG. 1 are selectively turned on or off according to the local oscillating signal including LO_Q_p and LO_Q_n, and the switching transients ST_Q_1-ST_Q_4 occur around the zero-crossing points of LO_Q_p and LO_Q_n. With the help of the control signal SC_Q adequately generated from the controller 106, the mixer output is protected from being affected by noise originated from the noisy transistors during the switching transients.

It should be noted that, in above exemplary embodiment, the controller 106 generates the control signal SC_I/SC_Q through processing the local oscillating signal. However, this is not meant to be a limitation of the present invention. Any available technique capable of generating the desired control signal SC_I/SC_Q to reduce the load value of the controllable load 102 during switching transients can be employed by the controller 106. This also obeys the spirit of the present invention.

Additionally, in above embodiment, the controllable load 102 could be implemented using a quadrature switched load whose load value is adjusted through a switch control means. Some exemplary examples of the quadrature switched load are illustrated as follows.

Figure 3:
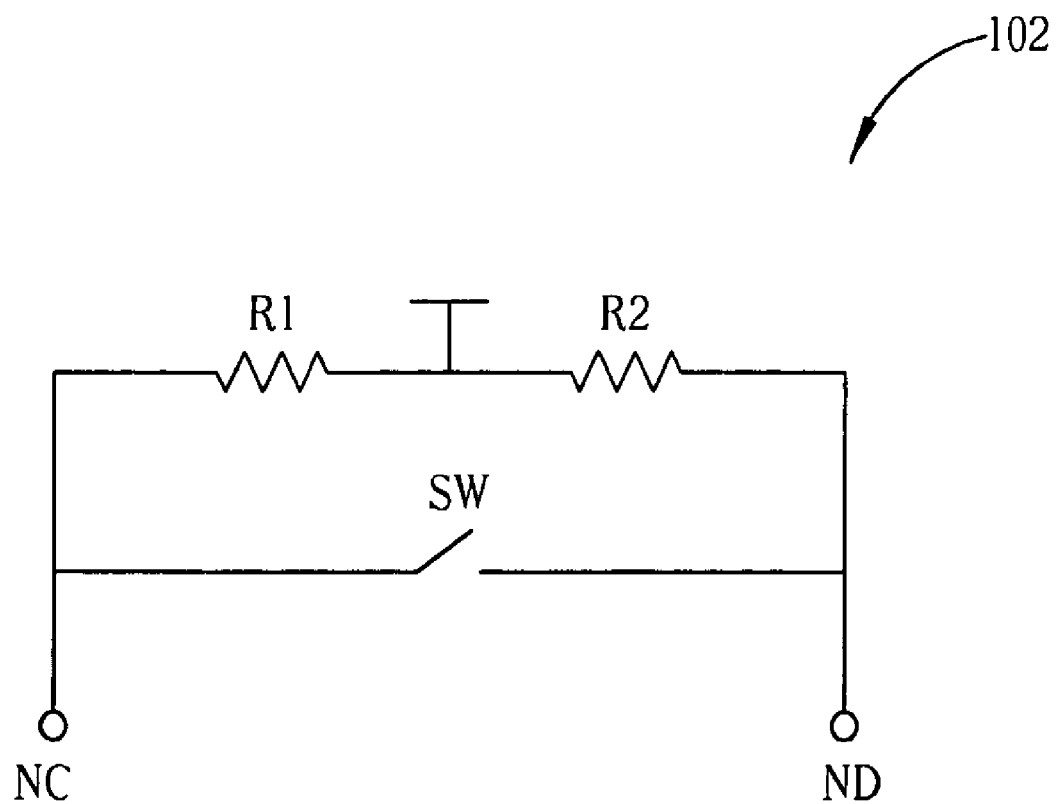
FIG. 3 is a circuit diagram illustrating a first embodiment of a controllable load shown in FIG. 1.

FIG. 3 is a circuit diagram illustrating a first embodiment of the controllable load 102 shown in FIG. 1. The controllable load 102 has a first load device implemented using a resistor R1, a second load device implemented using a resistor R2, and a switch device SW connected to the resistors R1 and R2 via a parallel connection. Therefore, when the switch device SW is switched on due to pulses of the control signal SC_I/SC_Q, nodes NC and ND of the output port of the signal mixing module 104 are shorted. As a result, the equivalent load value of the controllable load 102 is set to zero, thereby blocking the noise from being presented at the mixer output. In other words, the switch device SW in FIG. 3 is for coupling node NC to node ND according to the control signal SC_I/SC_Q during switching transients of the local oscillation signal.

Figure 4:
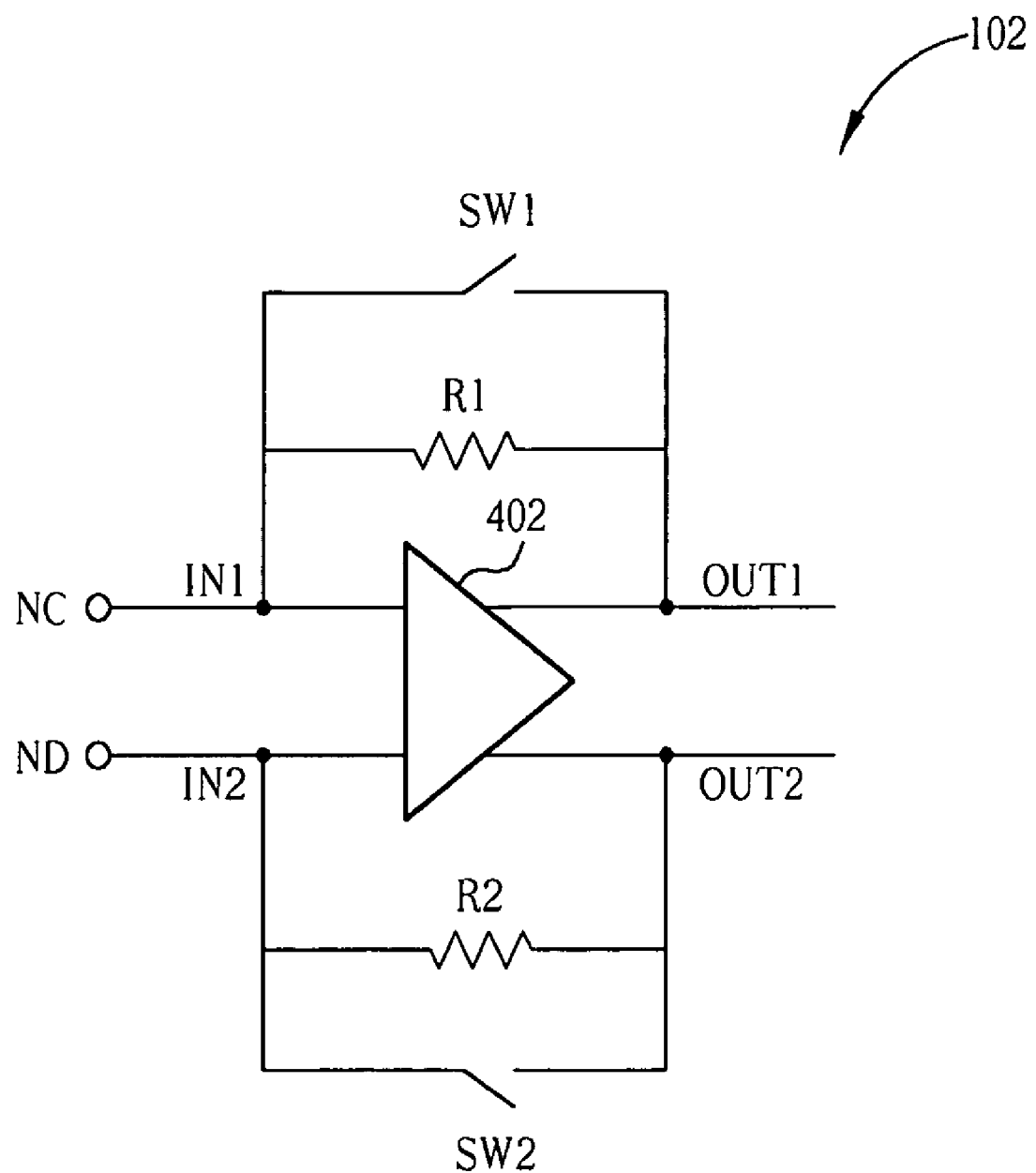
FIG. 4 is a circuit diagram illustrating a second embodiment of the controllable load shown in FIG. 1.

FIG. 4 is a circuit diagram illustrating a second embodiment of the controllable load 102 shown in FIG. 1. The controllable load 102 has an operational amplifier 402 having input nodes IN1, IN2 and output nodes OUT1, OUT2, where the input nodes IN1, IN2 are coupled to nodes NC and ND of the output port of the signal mixing module 104, respectively. In addition, the controllable load 102 further has a first load device implemented using a transistor R1, a second load device implemented using a transistor R2, a first switch device SW1, and a second switch device SW2, where transistor R1 and the first switch device SW1 are coupled between input node IN1 and output node OUT1 of the operational amplifier 402, and the transistor R2 and the second switch device SW2 are coupled between the input node IN2 and output node OUT2 of the operational amplifier 402. When the switch devices SW1 and SW2 are both switched on due to pulses of the control signal SC_I/SC_Q, the feedback resistors R1 and R2 of the operational amplifier 402 are bypassed (i.e., the load value of the controllable load 102 is equivalently set to zero), leading to noise blocking at nodes NC and ND of the output port of the signal mixing module 104. In other words, the first switch device SW1 is controlled by the control signal SC_I/SC_Q for coupling the input node IN1 to the output node OUT1 of the operational amplifier 402 during switching transients of the local oscillation signal; and the second switch device SW2 is controlled by the control signal SC_I/SC_Q for coupling the other input node IN2 to the other output node OUT2 of the operational amplifier 402 during switching transients of the oscillation signal.

Figure 5:
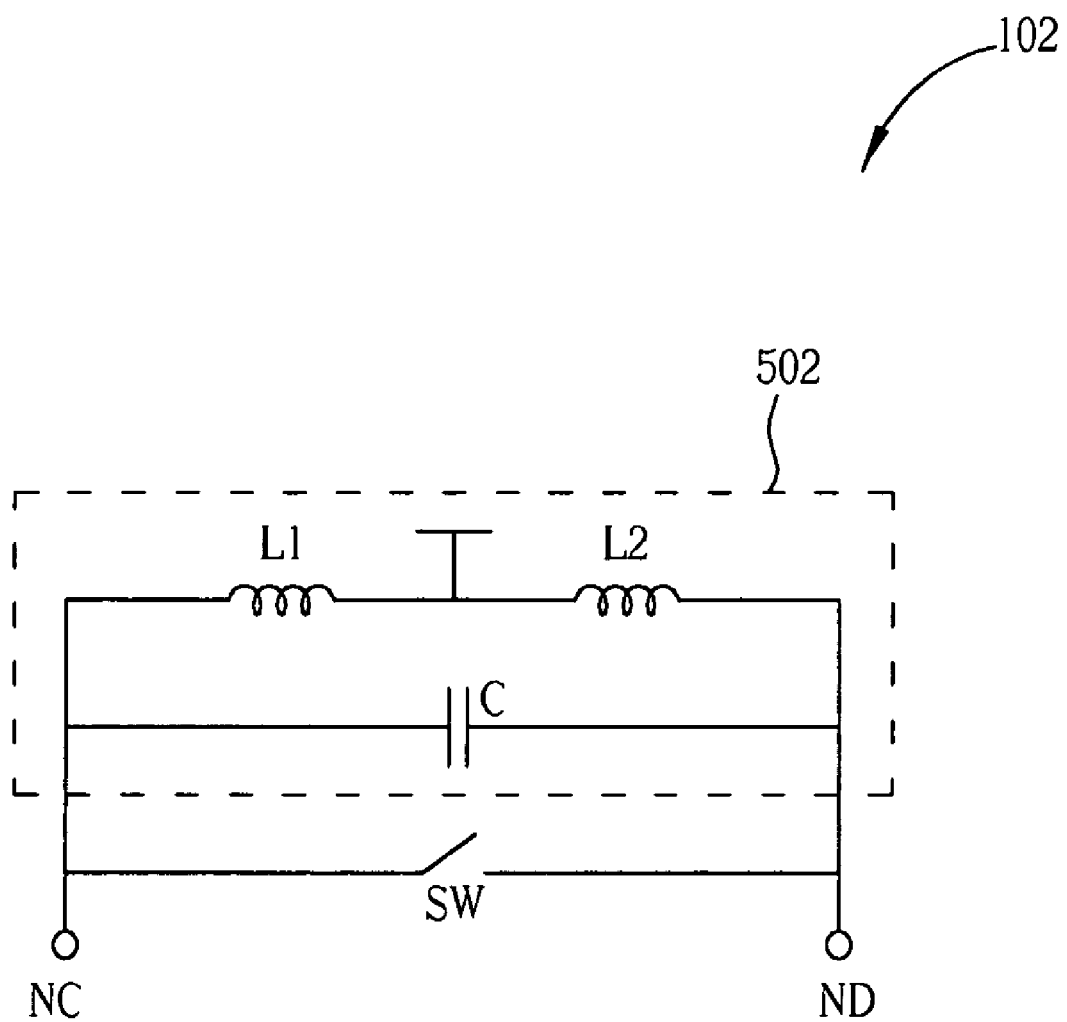
FIG. 5 is a circuit diagram illustrating a third embodiment of the controllable load shown in FIG. 1.

FIG. 5 is a circuit diagram illustrating a third embodiment of the controllable load 102 shown in FIG. 1. The controllable load 102 includes an LC tank 502 having inductors L1, L2 and a capacitor C, and is coupled between node NC and node ND of the output port of the signal mixing module 104. Additionally, a switch device SW is for selectively coupling node NC to node ND. That is, the switch device SW is controlled by pulses of the control signal SC_I/SC_Q to connect node NC to node ND during switching transients of the local oscillation signal. In this way, the equivalent load value of the controllable load 102 is set to zero during switching transients of the local oscillating signal.

Figure 6:
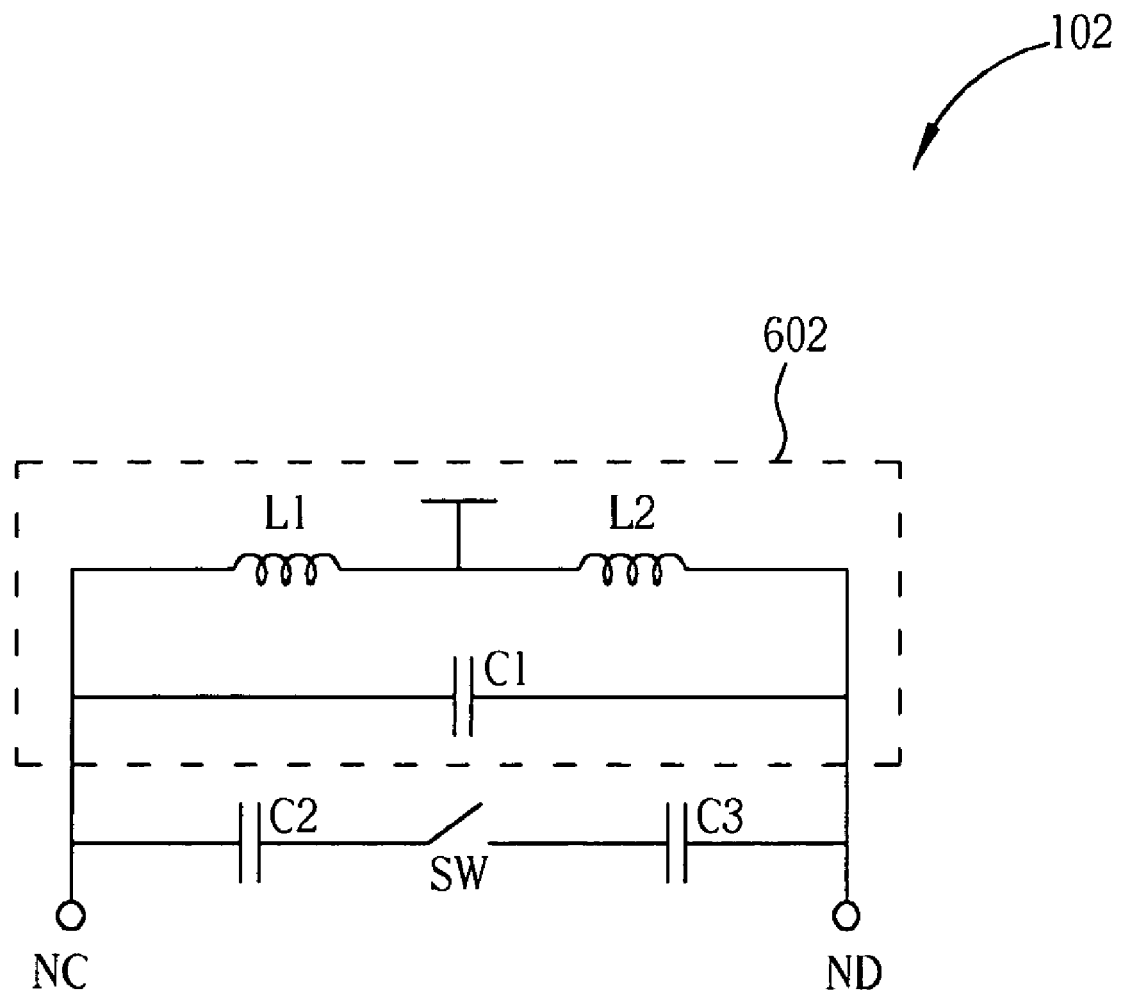
FIG. 6 is a circuit diagram illustrating a fourth embodiment of the controllable load shown in FIG. 1.

FIG. 6 is a circuit diagram illustrating a fourth embodiment of the controllable load 102 shown in FIG. 1. The controllable load 102 includes an LC tank 602 implemented using inductors L1, L2 and a capacitor C1, and is coupled between node NC and node ND of the output port of the signal mixing module 104. In addition, the controllable load 102 also has at least one frequency tuning component coupled to the output port of the signal mixing module 104 for adjusting an oscillating frequency of the LC tank 602 when active. As shown in FIG. 6, two capacitors C2 and C3, acting as frequency tuning components, are coupled to node NC and node ND respectively. Furthermore, a switch device SW is for selectively coupling the frequency tuning component(s) at one node of the output port to another node of the output port. That is, when the switch device SW is switched on due to pulses of the control signal SC_I/SC_Q, each of the capacitors C2 and C3 is coupled between nodes NC and ND and becomes active to shift the oscillating frequency of the LC tank 602. In this way, during switching transients of the local oscillating signal, the load value of the controllable load 102 is equivalently reduced due to the oscillating frequency shifting.

Figure 7:
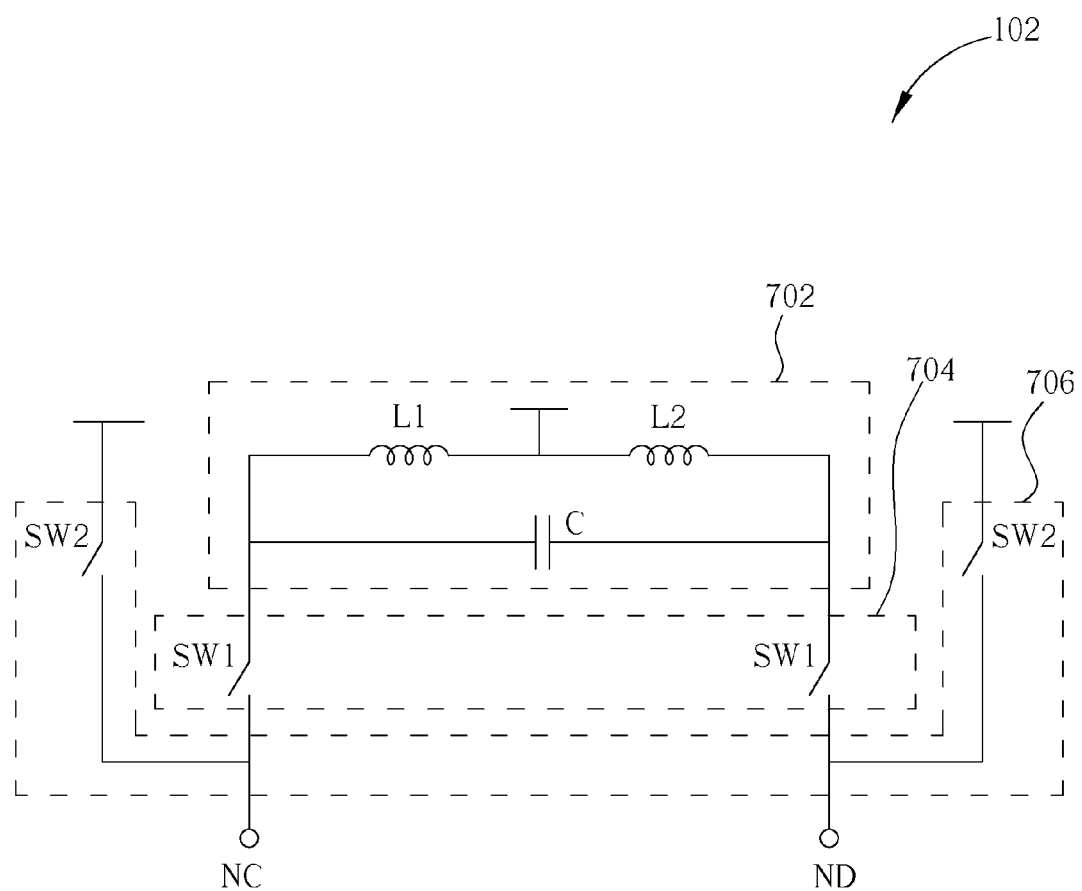
FIG. 7 is a circuit diagram illustrating a fifth embodiment of the controllable load shown in FIG. 1.

FIG. 7 is a circuit diagram illustrating a fifth embodiment of the controllable load 102 shown in FIG. 1. The controllable load 102 includes an LC tank implemented using inductors L1, L2 and a capacitor C; a first switch module 704 including a plurality of switch devices SW1; and a second switch module 706 including a plurality of switch devices SW2. In this embodiment, the first switch module 704 and the second switch module 706 are not switched on simultaneously. For example, the first switch module 704 is controlled by the control signal SC_I/SC_Q, while the second switch module 706 is controlled by an inverse version of the control signal SC_I/SC_Q. In this way, the first switch module 704 is controlled by the control signal SC_I/SC_Q to disconnect the LC tank 702 from nodes NC and ND of the output port of the signal mixing module 104 during switching transients of the local oscillation signal; while the second switch module 706 is controlled by the control signal SC_I/SC_Q to couple nodes NC and ND of the output port of the signal mixing module 104 to a predetermined reference voltage during switching transients of the local oscillation signal. In this way, the equivalent load value of the controllable load 102 is set to zero during switching transients of the local oscillating signal.

Please note that the circuit configurations shown in FIGS. 3-7 are for illustrative purposes only, and are not meant to be limitations of the present invention. Without departing from the spirit of the present invention, modifications made to the circuit configurations shown in FIGS. 3-7 are possible. These alternative designs all fall in the scope of the present invention.

Those skilled in the art will readily observe that numerous modifications and alterations of the device and method may be made while retaining the teachings of the invention.

What is claimed is:

1. A mixer comprising:
   a controllable load, controlled by a control signal to change an equivalent load value thereof;
   a signal mixing module, having an output port coupled to the controllable load and an input port coupled to an input signal, for mixing the input signal with a local oscillation signal; and
   a controller, coupled to the controllable load, for generating the control signal to reduce the equivalent load value of the controllable load during switching transients of the local oscillation signal, wherein the equivalent load value during a switching transient of the local oscillation signal is smaller than the equivalent load value during an interval between the switching transient and an adjacent switching transient.

2. The mixer of claim 1, wherein the controllable load is a quadrature switched load comprising:
   a first load device, coupled to a first node of the output port, the first load device having a fixed load value;
   a second load device, coupled to a second node of the output port, the second load device having a fixed load value; and
   a switch device, for selectively coupling the first node to the second node, wherein the switch device is controlled by the control signal to coupe the first node to the second node during switching transients of the local oscillation signal.

3. The mixer of claim 1, wherein the controllable load is a quadrature switched load comprising:
   an operational amplifier, having a first input node, a second input node, a first output node, and a second output node, wherein the first input node is coupled to a first node of the output port, and the second input node is coupled to a second node of the output port;
   a first load device, coupled between the first input node and the first output node of the operational amplifier;
   a second load device, coupled between the second input node and the second output node of the operational amplifier;
   a first switch device, for selectively coupling the first input node to the first output node of the operational amplifier, wherein the first switch device is controlled by the control signal to coupe the first input node to the first output node during switching transients of the local oscillation signal; and
   a second switch device, for selectively coupling the second input node to the second output node of the operational amplifier, wherein the second switch device is controlled by the control signal to coupe the second input node to the second output node during switching transients of the oscillation signal.

4. The mixer of claim 1, wherein the controllable load is a quadrature switched load comprising:
   an LC tank, coupled between a first node and a second node of the output port; and
   a switch device, for selectively coupling the first node to the second node, wherein the switch device is controlled by the control signal to coupe the first node to the second node during switching transients of the local oscillation signal.

5. The mixer of claim 1, wherein the controllable load is a quadrature switched load comprising:
   an LC tank, coupled between a first node and a second node of the output port;
   at least a frequency tuning component, coupled to a first node of the output port, for adjusting an oscillating frequency of the LC tank when active; and
   a switch device, for selectively coupling the frequency tuning component to a second node of the output port, wherein the switch device is controlled by the control signal to coupe the frequency tuning component to the second node during switching transients of the local oscillation signal.

6. The mixer of claim 1, wherein the controllable load is a quadrature switched load comprising:
   an LC tank;
   a first switch module, comprising switch devices for selectively coupling the LC tank to the output port, wherein the first switch module is controlled by the control signal to disconnect the LC tank from the output port during switching transients of the local oscillation signal; and
   a second switch module, comprising switch devices for selectively coupling the output port to a predetermined reference voltage, wherein the second switch module is controlled by the control signal to couple the output port to a predetermined reference voltage during switching transients of the local oscillation signal.

7. The mixer of claim 1, wherein only during the switching transients of the local oscillation signal, the control signal controls the controllable load to reduce the equivalent load value.

8. A mixer comprising:
   a controllable load, controlled by a control signal to change an equivalent load value thereof;
   a signal mixing module, having an output port coupled to the controllable load and an input port coupled to an input signal, for mixing the input signal with a local oscillation signal; and
   a controller, coupled to the controllable load, for processing the local oscillation signal to generate the control signal, and outputting the control signal to the controllable load to reduce the equivalent load value of the controllable load during switching transients of the local oscillation signal.

9. The mixer of claim 8, wherein the controllable load is a quadrature switched load comprising:

a first load device, coupled to a first node of the output port, the first load device having a fixed load value;

a second load device, coupled to a second node of the output port, the second load device having a fixed load value; and a switch device, for selectively coupling the first node to the second node, wherein the switch device is controlled by the control signal to coupe the first node to the second node during switching transients of the local oscillation signal.

10. The mixer of claim 8, wherein the controllable load is a quadrature switched load comprising:

an operational amplifier, having a first input node, a second input node, a first output node, and a second output node, wherein the first input node is coupled to a first node of the output port, and the second input node is coupled to a second node of the output port;

a first load device, coupled between the first input node and the first output node of the operational amplifier;

a second load device, coupled between the second input node and the second output node of the operational amplifier;

a first switch device, for selectively coupling the first input node to the first output node of the operational amplifier, wherein the first switch device is controlled by the control signal to coupe the first input node to the first output node during switching transients of the local oscillation signal; and a second switch device, for selectively coupling the second input node to the second output node of the operational amplifier, wherein the second switch device is controlled by the control signal to coupe the second input node to the second output node during switching transients of the oscillation signal.

11. The mixer of claim 8, wherein the controllable load is a quadrature switched load comprising:

an LC tank, coupled between a first node and a second node of the output port; and a switch device, for selectively coupling the first node to the second node, wherein the switch device is controlled by the control signal to coupe the first node to the second node during switching transients of the local oscillation signal.

12. The mixer of claim 8, wherein the controllable load is a quadrature switched load comprising:

an LC tank, coupled between a first node and a second node of the output port;

at least a frequency tuning component, coupled to a first node of the output port, for adjusting an oscillating frequency of the LC tank when active; and a switch device, for selectively coupling the frequency tuning component to a second node of the output port, wherein the switch device is controlled by the control signal to coupe the frequency tuning component to the second node during switching transients of the local oscillation signal.

13. The mixer of claim 8, wherein the controllable load is a quadrature switched load comprising:

an LC tank;

a first switch module, comprising switch devices for selectively coupling the LC tank to the output port, wherein the first switch module is controlled by the control signal to disconnect the LC tank from the output port during switching transients of the local oscillation signal; and a second switch module, comprising switch devices for selectively coupling the output port to a predetermined reference voltage, wherein the second switch module is controlled by the control signal to couple the output port to a predetermined reference voltage during switching transients of the local oscillation signal.

14. A mixer comprising:

a controllable load, controlled by a control signal to change an equivalent load value thereof;

a signal mixing module, having an output port coupled to the controllable load and an input port coupled to an input signal, for mixing the input signal with a local oscillation signal; and a controller, coupled to the controllable load, for generating the control signal to reduce the equivalent load value of the controllable load to substantially zero during switching transients of the local oscillation signal.

15. The mixer of claim 14, wherein the controllable load is a quadrature switched load comprising:

a first load device, coupled to a first node of the output port, the first load device having a fixed load value;

a second load device, coupled to a second node of the output port, the second load device having a fixed load value; and a switch device, for selectively coupling the first node to the second node, wherein the switch device is controlled by the control signal to coupe the first node to the second node during switching transients of the local oscillation signal.

16. The mixer of claim 14, wherein the controllable load is a quadrature switched load comprising:

an operational amplifier, having a first input node, a second input node, a first output node, and a second output node, wherein the first input node is coupled to a first node of the output port, and the second input node is coupled to a second node of the output port;

a first load device, coupled between the first input node and the first output node of the operational amplifier;

a second load device, coupled between the second input node and the second output node of the operational amplifier;

a first switch device, for selectively coupling the first input node to the first output node of the operational amplifier, wherein the first switch device is controlled by the control signal to coupe the first input node to the first output node during switching transients of the local oscillation signal; and a second switch device, for selectively coupling the second input node to the second output node of the operational amplifier, wherein the second switch device is controlled by the control signal to coupe the second input node to the second output node during switching transients of the oscillation signal.

17. The mixer of claim 14, wherein the controllable load is a quadrature switched load comprising:

an LC tank, coupled between a first node and a second node of the output port; and a switch device, for selectively coupling the first node to the second node, wherein the switch device is controlled by the control signal to coupe the first node to the second node during switching transients of the local oscillation signal.

18. The mixer of claim 14, wherein the controllable load is a quadrature switched load comprising:

an LC tank, coupled between a first node and a second node of the output port;

at least a frequency tuning component, coupled to a first node of the output port, for adjusting an oscillating frequency of the LC tank when active; and a switch device, for selectively coupling the frequency tuning component to a second node of the output port, wherein the switch device is controlled by the control signal to coupe the frequency tuning component to the second node during switching transients of the local oscillation signal.

19. The mixer of claim 14, wherein the controllable load is a quadrature switched load comprising:
   an LC tank;
   a first switch module, comprising switch devices for selectively coupling the LC tank to the output port, wherein the first switch module is controlled by the control signal to disconnect the LC tank from the output port during switching transients of the local oscillation signal; and
   a second switch module, comprising switch devices for selectively coupling the output port to a predetermined reference voltage, wherein the second switch module is controlled by the control signal to couple the output port to a predetermined reference voltage during switching transients of the local oscillation signal.

* * * * *